United States Patent
Hur et al.

(10) Patent No.: US 7,149,140 B2
(45) Date of Patent: Dec. 12, 2006

(54) METHOD OF REFRESHING A MEMORY DEVICE UTILIZING PASR AND PILED REFRESH SCHEMES

(75) Inventors: Hwang Hur, Kyoungki-do (KR); Tae Yun Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/125,687

(22) Filed: May 10, 2005

(65) Prior Publication Data

US 2006/0104139 A1  May 18, 2006

(30) Foreign Application Priority Data

Nov. 15, 2004 (KR) .................. 10-2004-0093117

(51) Int. Cl.
G11C 7/00 (2006.01)
G11C 8/00 (2006.01)
(52) U.S. Cl. ...................... 365/222; 365/201
(58) Field of Classification Search ........... 365/222, 365/201, 230.03, 227
See application file for complete search history.

(56) References Cited

U.S. PATENT DOCUMENTS

| 6,246,619 B1 * | 6/2001 | Ematrudo et al. ........ 365/201 |
| 6,590,822 B1 * | 7/2003 | Hwang et al. ........... 365/222 |
| 6,650,587 B1 * | 11/2003 | Derner et al. ........... 365/222 |
| 6,950,364 B1 * | 9/2005 | Kim .................... 365/222 |
| 2005/0270874 A1 * | 12/2005 | Hur et al. ............... 365/222 |

FOREIGN PATENT DOCUMENTS

| KR | 1999 0042331 | 6/1999 |
| KR | 10-2004 0040579 | 5/2004 |

* cited by examiner

*Primary Examiner*—Anh Phung
(74) *Attorney, Agent, or Firm*—Ladas & Parry LLP

(57) ABSTRACT

In a memory device having an N number of banks, a refresh operation according to a piled refresh scheme is performed during a self-refresh mode to refresh the N number of banks in regular sequence when it is necessary to refresh all of the N number of banks. A refresh operation according to a Partial Array Self Refresh (PASR) scheme is performed during a self-refresh mode when it is necessary to refresh only an i number of banks (where $1<i\leq N-1$) from among the N number of banks. During an auto-refresh mode, a refresh operation according to the piled refresh scheme is performed.

6 Claims, 4 Drawing Sheets

| refresh mode | partial array self refresh | piled refresh |
|---|---|---|
| SELF | YES | NO (IN THE CASE OF PASR CODE FOR REFRESHING ALL BANK: YES) |
| AUTO | NO | YES |

METHOD OF REFRESHING A MEMORY DEVICE UTILIZING PASR AND PILED REFRESH SCHEMES

BACKGROUND OF THE INVENTION

1. Field of the invention

The present invention relates generally to a method of refreshing a semiconductor memory device, and more particularly to applying a bank-based Partial Array Self Refresh (PASR) scheme to the semiconductor memory device having a piled refresh function.

2. Description of the Prior Art

As generally known in the art, the volatile memory devices such as a dynamic random access memory (DRAM), a double data rate synchronous dynamic random access memory (DDR SDRAM), and others (hereinafter the "memory devices") require periodic refresh operations to prevent data loss in the memory cells.

The refresh operations performed in the memory devices are classified largely into two modes: the auto-refresh mode and the self-refresh mode.

In case of the auto-refresh mode, refresh operations are performed in a memory device, while the memory device is in an operating state for data access, in response to a refresh command from an external device external. In case of the self-refresh mode, refresh operations are performed in the memory device, while the memory device is in an idle state, e.g., not operating for data access, in response to a refresh command generated by the memory device itself.

A typical refresh operation consumes a large amount of electric current. The Partial Array Self Refresh (PASR) scheme has been developed to reduce the current consumption required for refresh operations performed during a self-refresh mode.

According to the PASR scheme, a refresh command is applied to the memory device in the self-refresh mode to refresh only pre-selected areas of memory cells storing data. Thus, the PASR scheme is effective only in the case when the information about the data stored in the relevant cells of the memory device is known to an external system before refreshing.

FIG. 1 illustrates a bank-based PASR scheme in a memory cell array having four memory banks: bank <0> 100, bank <1> 101, bank <2> 102, and bank <3> 103. FIG. 1 also shows a table listing the PASR codes A2, A1 and A0 according to which all or a selected number of banks are to be refreshed. Thus, the "bank-based" PASR scheme refers to a refreshing scheme for refreshing all or a sub-combination of banks 100, 101, 102, 103 according to the PASR codes A2, A1, A0 of the table in FIG. 1. For example, as shown in FIG. 1, the address signals A2, A1, A0 may be set to "0 0 1" to refresh the banks 100 and 101 but not the banks 102 and 103. When the address signals A2, A1, A0 are set to '0 0 0', all memory banks 100, 101, 102, 103 are to be refreshed. When the address signals A2, A1, A0 are set to '0 1 0', only the memory bank 100 is to be refreshed.

Therefore, the PASR scheme makes it possible to selectively refresh all or a certain number of specific banks, and this allows reduction of the current consumed by the memory device.

FIG. 2 is shown to illustrate the piled refresh scheme in a DDR SDRAM.

The piled refresh scheme is designed to prevent peak current consumption that may occur if all the banks 100, 101, 102, 103 are allowed to be refreshed simultaneously. Under the piled refresh scheme, the refresh operations are instead performed in sequence one bank at a given time.

For example while referring to FIG. 2, after a refresh command for the bank <0> 100 is applied, a predetermined period of time passes, and then a refresh command for the bank <1> 101 is applied. In the same manner, the bank <2> 102 and the bank <3> 103 are sequentially refreshed one by one after a predetermined time interval.

As described above, since the banks 100, 101, 102, 103 are sequentially refreshed by the piled refresh scheme, it is possible to prevent the peak current consumption which could occur if all four banks are refreshed simultaneously.

As generally known in the art, the piled refresh scheme of FIG. 2 is utilized in a DDR SDRAM in order to reduce the peak current consumption. However, the Joint Electron Device Engineering Council (JEDEC) is considering to adopt the PASR scheme, as described in FIG. 1, in the design of the next generation DDR SDRAM.

For this reason, the novel techniques of applying the PASR scheme to a DDR SDRAM utilzing the piled refresh scheme, among others, are claimed and fully described in the present application.

SUMMARY OF THE INVENTION

Accordingly, the present invention has been made to solve the above-mentioned problems occurring in the prior art, and the present invention proposes a refresh operation scheme in which a PASR scheme and a piled refresh scheme are merged together.

That is, the present invention provides a method for applying the PASR scheme to a DDR SDRAM employing the piled refresh scheme.

In addition, the present invention proposes a method of performing a refresh operation according to the piled refresh scheme when a PASR code for refreshing all the banks is applied, and of performing a burst refresh operation when a PASR code for refreshing only a specific bank (or specific banks) is applied. Herein, the burst refresh refers to simultaneously performing a refresh operation for one bank or multiple banks specified by a PASR code.

In order to accomplish this object, there is provided a method for refreshing a memory device having N number of banks, the method comprising the steps of: performing a piled refresh operation when it is necessary to refresh all of the N number of banks; and performing a burst refresh operation based on a Partial Array Self Refresh (PASR) scheme when it is necessary to refresh i number of banks (herein, 1<i≦N−1) from among the N number of banks.

In accordance with another aspect of the present invention, there is provided a method for refreshing a memory device having N number of banks, the method comprising the steps of: in a self-refresh mode, performing a refresh operation according to a piled refresh scheme of refreshing the N number of banks in regular sequence when it is necessary to refresh all of the N number of banks, and performing a refresh operation according to a Partial Array Self Refresh (PASR) scheme when it is necessary to refresh i number of banks (herein, 1<i≦N−1) from among the N number of banks; and in an auto-refresh mode, performing a refresh operation according to the piled refresh scheme.

In accordance with still another aspect of the present invention, there is provided a method for refreshing a memory device having N number of banks, the method comprising the steps of: a) receiving a refresh command; b) generating a signal for selecting a first bank from among the N number of banks to be refreshed, by the refresh command;

c) receiving the refresh command and a Partial Array Self Refresh (PASR) code, and generating a signal for determining whether it is necessary to perform a piled refresh operation or to perform a burst refresh operation based on a PASR scheme for the N number of banks d) receiving the signals generated in steps b) and c), and generating an address signal for the first bank to be refreshed; e) generating a refresh signal for refreshing the first bank which is indicated by the address signal for the first bank; f) performing a refresh operation according to the refresh signal generated in step e), wherein steps b), d), e) and f) are repeatedly performed when it is necessary to perform the piled refresh operation as a result of determination in step c), and steps b), d) and e) are repeatedly performed until banks to be refreshed are all selected, and then step e) is performed, when it is necessary to perform the burst refresh operation as a result of determination in step c).

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
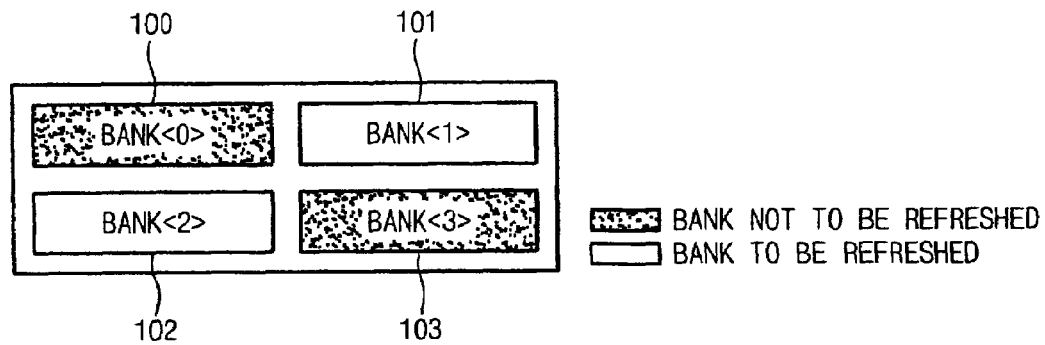
FIG. 1 shows a schematic diagram for illustrating a bank-based Partial Array Self Refresh (PASR) scheme.
Figure 2:
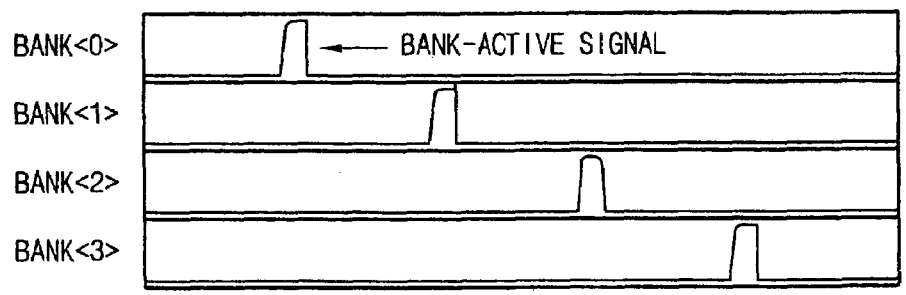
FIG. 2 is a diagram for illustrating a piled refresh scheme applied in a DDR SDRAM.

Hereinafter, a preferred embodiment of the present invention will be described with reference to the accompanying drawings. In the following description and drawings, the same reference numerals may be used to designate the same or similar components, and so repetition of the description on the same or similar components will be omitted.

Figure 3:
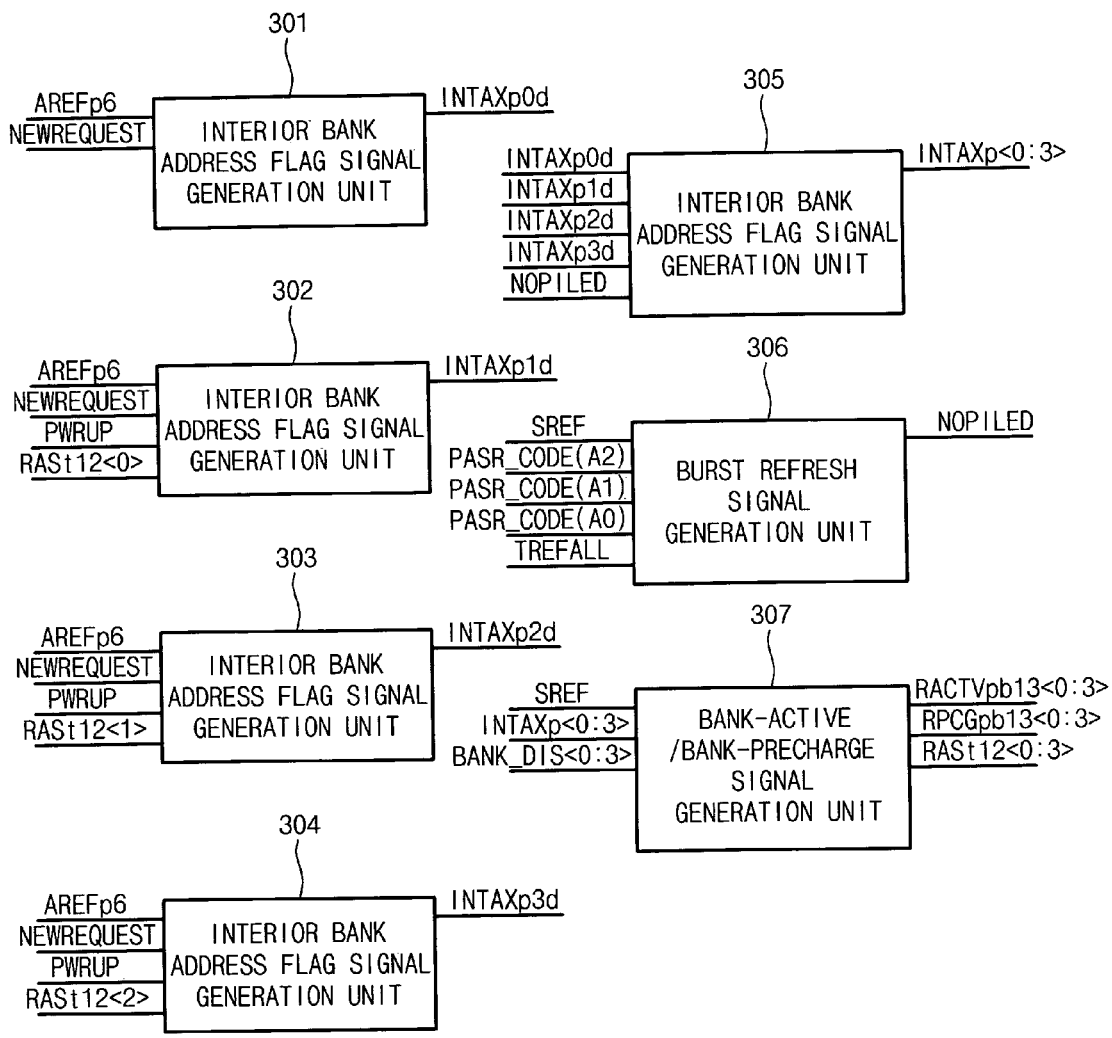
FIG. 3 is a block diagram for illustrating a refresh method according than embodiment of the present invention.

FIG. 3 is a block diagram showing the refresh circuit and the refresh method thereof according to an embodiment of the present invention. The refresh circuit of FIG. 3 are shown and explained to refresh four memory banks similar to FIG. 1 but no shown specifically in FIG. 3. However, the present invention are not limited to refreshing just four memory banks, but refreshing operations of any number of banks are possible according to the present invention. The four banks (not shown in FIG. 3) are referred to as a first bank (i.e., a bank #0) to a fourth bank (i.e., a bank #3) below.

As shown in FIG. 3, the structure for performing the refresh method according to an embodiment of the present invention includes: five interior bank address flag signal generation units 301, 302, 303, 304, 305; a burst refresh signal generation unit 306; and a bank-active/bank-precharge signal generation unit 307.

As shown in FIG. 3, 'AREFp6' and 'NEWREQUEST' signals are inputted to the interior flag signal generation units 301, 302, 303, 304. 'AREFp6' signifies the presence of the auto-refresh mode, and 'NEWREQUEST' signifies the presence of the self-refresh mode. The 'AREFp6' is inputted to the respective units when an auto-refresh command is present. The 'NEWREQUEST' signal is an internal refresh command, which is periodically generated after entering into a self-refresh mode after every predetermined time interval.

A 'PWRUP' signal is inputted to the interior flag signal generation units, 302, 303, 304 and indicates the power up status.

'RASt12<0>', 'RASt12<1>', 'RASt12<2>', and 'RASt12<3>', are coded in the output signal 'RASt12<0:3>' of the bank-active/bank-precharge signal generation unit 307 and are respectively inputted to the interior flag signal generation units 302, 303, 304.

The interior bank address flag signal generation unit 301 generates a first interior bank address flag signal 'INTAXp0d' when any one of the signals 'AREFp6' and 'NEWREQUEST' is enabled, that is, in either auto or self-refresh mode. For example, the first bank (i.e., bank #0) is to be refreshed in this embodiment when the signal 'INTAXp0d' is outputted by the unit 301.

The interior bank address flag signal generation unit 302 generates a second interior bank address flag signal 'INTAXp1d' for refreshing a second bank (i.e., bank #1) in the memory device. The unit 302 receives signals 'AREFp6', 'NEWREQUEST', 'PWRUP', and 'RASt12<0>'. The 'RASt12<0>' is one of the output signals of the bank-active/bank-precharge signal generation unit 307.

The signals 'RASt12<0:3>' (outputted from the unit 307) represent whether any one of the banks #0–#3 is in an active state or in a precharge state, and more about this is described in detail below. For example, 'RASt12<0>' is a signal representing whether the second bank (the bank #1) is in an active state or in a precharge state. When the second bank (the bank #1) is in an active state, the signal 'RASt12<0>' is activated to a predetermined state (for example, set to a high level). In contrast, when the second bank is in a precharge state, the signal 'RASt12<0>' is not activated (for example, set to the opposite state of the 'RASt12<0>' signal produced in the activated state).

The structure and operations of interior bank address flag signal generation units 303 and 304 are identical to those of the second interior bank address flag signal generation unit 302.

The interior bank address flag signal generation unit 303 receives 'RASt12<1>' among other signals and generates 'INTAXp2d' to refresh the third bank (or the bank #2) in the memory device.

The interior bank address flag signal generation unit 304 receives 'RASt12<2>' among other signals and generates 'INTAXp3d' to refresh the fourth bank (or the bank #3) in the memory device.

The interior bank address flag signal generation unit 305 receives all output signals 'INTAXp0d', 'INTAXp1d', 'INTAXp2d', and 'INTAXp3d' of the units 301, 302, 303, 304 and converts them into an interior address signal 'INTAXp<0:3>', which indicates which banks to be refreshed. A signal 'NOPILED' inputted to the interior bank address flag signal generation unit 305 is a signal for determining whether a piled refresh scheme is to be applied to the memory banks (i.e., banks #0, #1, #2, #3) in the memory device.

The burst refresh signal generation unit 306 determines whether a burst refresh scheme or a piled refresh scheme is to be applied to the memory device. A signal 'SREF' inputted to the unit 306 is activated or enabled in the self-refresh mode. Also, 'PASR_CODE (A2)', PASR_CODE (A1)' and 'PASR_CODE (A0)' are PASR code signals (such as the 'A2, A1, A0' signals discussed with reference to FIG. 1), and 'TREFALL' is a signal representing a burst refresh test mode.

The output signal 'NOPILED' of the burst refresh signal generation unit 306 is a signal for determining an appropriate refresh scheme. In operation, the piled refresh operation is performed when the signal 'NOPILED' is inactivated, and the burst refresh operation is performed when the signal 'NOPILED' is activated. For example, when a PASR code for refreshing only a partial bank(s) is applied, the signal 'NOPILED' is activated to perform the burst refresh operation. In contrast, when the PASR code for refreshing all banks is applied, the signal 'NOPILED' is inactivated to perform the piled refresh operation.

It should be noted that the PASR codes are valid only in the self-refresh mode. For this reason, in the auto-refresh mode, a burst refresh test mode signal 'TREFALL' is used to determine a refresh mode. Therefore, in the auto-refresh mode, the burst refresh test mode signal 'TREFALL' and the signal 'NOPILED' are identical (i.e., activated or inactivated) to each other.

The bank-active/bank-precharge signal generation unit 307 generates a bank-active signal 'RACTVpb13<0:3>' and a bank-precharge signal 'RPCGpb13<0:3>'.

The bank-active/bank-precharge signal generation unit 307 receives signals 'SREF' and 'INTAXp<0:3>' and outputs the signals 'RACTVpb13<0:3>', 'RPCGpb13<0:3>', and 'RASt12<0:3>'. The value of a signal 'BANK DIS<0:3>' is determined by a Mode Register Set 'MRS'. When the signal 'BANK DIS <0:3>' is in an active state, the interior address signal 'INTAXp<0:3>' is ignored although being applied, so that the bank-active signal is not activated. For example, when a signal 'BANK DIS<1>' is activated, a refresh operation for the bank #1 is ignored. When the signal 'BANK DIS<1>' is activated, signals 'RASt12<0:3>' are applied to the interior bank address flag signal generation units 302, 303, 304 while maintaining previous states.

The operation of the bank-active/bank-precharge signal generation unit 307 will now be described.

A first interior bank address signal 'INTAXp<0>' is applied to the bank-active/bank-precharge signal generation unit 307, so that a corresponding bank-active signal 'RACTVpb13<0>' is generated. When the bank-active signal 'RACTVpb13<0>' is generated, a signal 'RASt12<0>' corresponding to the bank-active signal 'RACTVpb13<0>' is generated. The signal 'RASt12<0>' is activated when the bank-active signal 'RACTVpb13<0>' is enabled, and is disabled when the bank-precharge signal 'RPCGpb13<0>' is activated. When the signal 'RASt12<0>' is activated, a first bank (the bank #0) is refreshed.

Next, the signal 'RASt12<0>' is applied to the interior bank address flag signal generation unit 302, so that a second bank address flag signal 'INTAXp1d' is generated. The signal 'INTAXp1d' is applied to the interior bank address flag signal generation unit 305, so that a second bank address signal 'INTAXp<0:3>' is generated. The signal 'INTAXp<0:3>' is applied to the bank-active/bank-precharge signal generation unit 307, so that a signal 'RASt12<1>' for refreshing the second bank is generated. By repeatedly performing the above-mentioned operations, it is possible to refresh the banks #0, #1; #2, and #3 in sequence.

In contrast, in the case of a burst refresh operation, the signals 'RASt12<0:2>' having an inactive state are applied to the interior bank address flag signal generation units 302, 303, 304. Thereafter, the interior bank address flag signal generation unit 305 applies signals 'INTAXp<0:3>' to the bank-active/bank-precharge signal generation unit 307 at the same time, thereby simultaneously refreshing all the banks (See FIG. 4).

Figure 4:
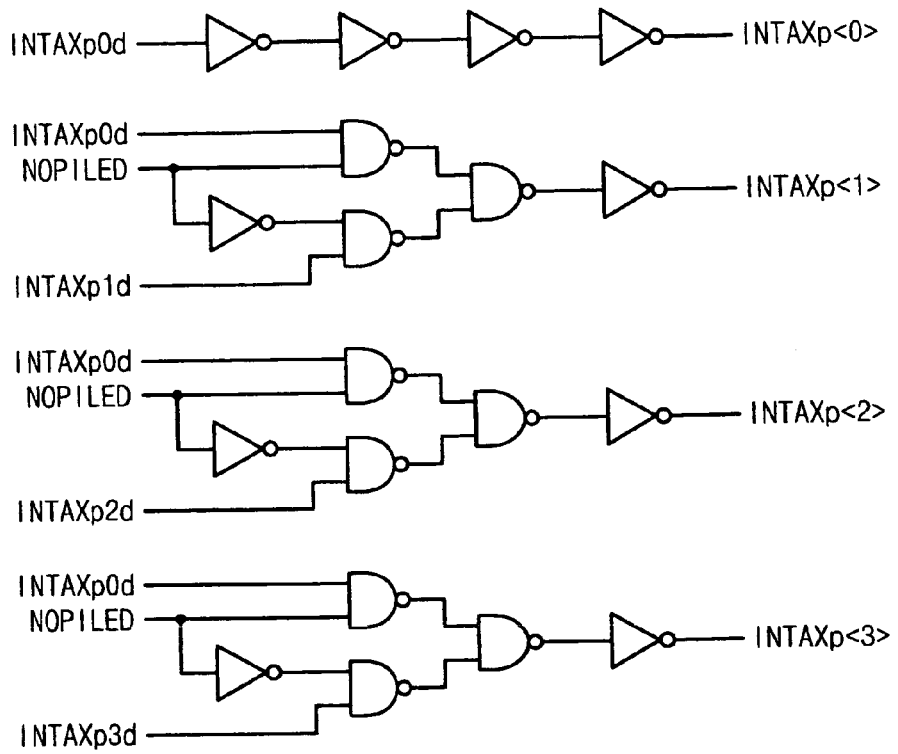
FIG. 4 is a circuit diagram illustrating an interior bank address flag signal generation unit as shown in FIG. 3 according to an embodiment of the present invention.

FIG. 4 is a circuit diagram illustrating the interior bank address flag signal generation unit 305 shown in FIG. 3 according to an embodiment of the present invention, which shows detailed functions of signals of determining whether or not to apply the burst refresh operation.

As shown in FIG. 4, a first interior bank address flag signal 'INTAXp0d' causes a first interior bank address signal 'INTAXp<0>' to be generated regardless of the signal 'NOPILED'.

However, the other bank address signals 'INTAXp<1:3>' are controlled by the signal 'NOPILED'.

For example, when the signal 'NOPILED' has the low level, interior bank address signals 'INTAXp<1>', 'INTAXp<2>' and 'INTAXp<3>' are generated by interior bank address flag signals 'INTAXp1d', 'INTAXp2d' and 'INTAXp3d', respectively. As described above, since the interior bank address flag signals 'INTAXp1d', 'INTAXp2d' and 'INTAXp3d' are generated in regular sequence, the interior bank address signals 'INTAXp<1>', 'INTAXp<2>' and 'INTAXp<3>' are also created in regular sequence. That is, it is possible to perform the piled refresh operation.

In contrast, when the signal 'NOPILED' has the high level, the respective interior bank address flag signals 'INTAXp1d', 'INTAXp2d' and 'INTAXp3d' are ignored. In this case, the interior bank address signals 'INTAXp<1>', 'INTAXp<2>' and 'INTAXp<3>' are determined by the first interior bank address flag signal 'INTAXp0d'. Therefore, the interior bank address signals 'INTAXp<1>', 'INTAXp<2>' and 'INTAXp<3>' are activated at the same time. As a result, when the signal 'NOPILED' has the high level, all the banks are refreshed at the same time. That is, the burst refresh operation is performed.

As described above, whether to per form the piled refresh operation or to perform the burst refresh operation is determined through the control of the logic level of the signal 'NOPILED'.

Figure 5:
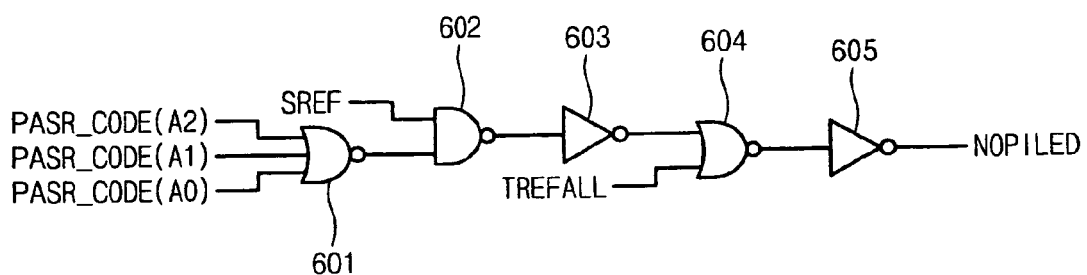
FIG. 5 is a circuit diagram illustrating a burst refresh signal generation unit as shown in FIG. 3 according to an embodiment of the present invention.

FIG. 5 is a circuit diagram illustrating the burst refresh signal generation unit 306 shown in FIG. 3 according to an embodiment of the present invention.

The circuit shown in FIG. 5 includes: an NOR gate 601 for receiving signals 'PASR_CODE(A2)', 'PASR_CODE (A1)' and 'PASR_CODE(A0)'; a NAND gate 602 for receiving the output signal of the NOR gate 601 and a signal 'SREF'; an inverter 603 for receiving the output signal of the NAND gate 602; an OR gate 604 for receiving the output signal of the inverter 603 and a burst refresh test mode signal 'TREFALL'; and an inverter 605 for receiving the output signal of the OR gate 604. The output signal of the inverter 605 is the signal 'NOPILED'.

As shown in FIG. 5, in the case of the self-refresh mode in which the signal 'SREF' is activated (for example, enabled at the high level) the signals 'PASR_CODE(A2)', 'PASR_CODE(A1)' and 'PASR CODE(A0)' are valid. In contrast, in the case of the auto-refresh mode in which the signal 'SREF' is not activated (for example, set to a low level), a refresh mode is determined by the burst refresh test mode signal 'TREFALL'.

Figures 6, 7:
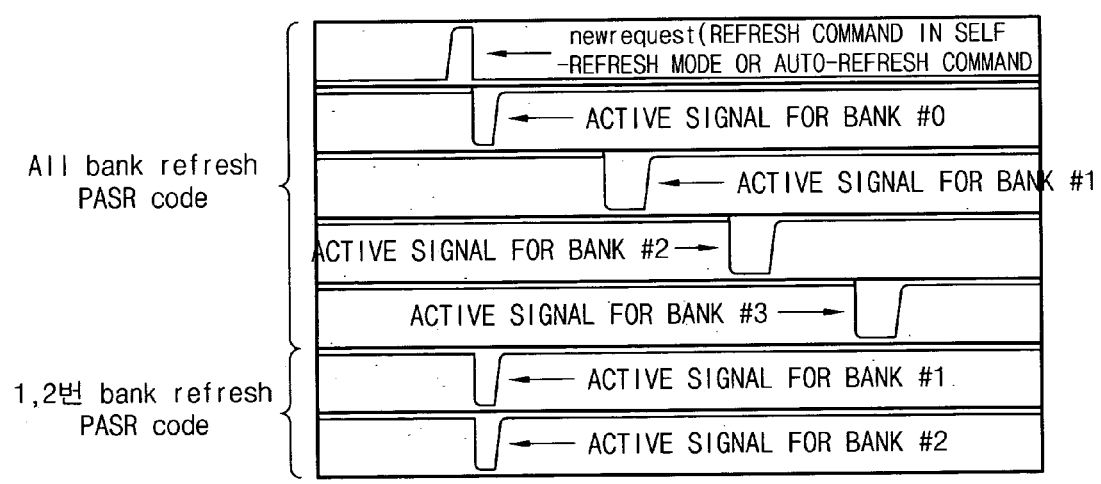
FIG. 6 is a table for illustrating refresh operations according to an embodiment of the present invention.
FIG. 7 is a diagram for illustrating a refresh operation according to an embodiment of the present invention.

FIG. 6 is a table for explaining refresh operations according to an embodiment of the present invention.

Referring to FIG. 6, in the case of the self-refresh mode (activated by the signal SREF), a burst refresh operation according to a partial array self-refresh (PASR) scheme is performed (See FIG. 5), except when the PASR scheme calls for refreshing all banks. In such a case, the piled refresh operation is performed when a PASR code calls for refreshing all banks. In a self-refresh mode, for example, if the PASR code is set to refresh just the banks #0 and #1, these two banks are refreshed simultaneously, i.e., burst refresh operations, rather than in sequence. On the other hand, if the PASR code is set to refresh all four banks #0, #1, #2, #3 in a self-refresh mode, the four banks are not refreshed simultaneously but are refreshed in sequence, i.e., piled refresh operations.

In contrast, in the case of the auto-refresh mode, only the piled refresh operations are performed.

The Table 1 below also summarizes the above-described operations, which are consistent with FIG. 6.

TABLE 1

|  | SELF-REFRESH MODE | AUTO-REFRESH MODE |
| --- | --- | --- |
| PASR CODE SPECIFIES REFRESHING ALL BANKS | PILED REFRESH | PILED REFRESH |
| PASR CODE SPECIFIES REFRESHING NOT ALL BANKS | BURST REFRESH |  |

As shown in Table 1, either the piled refresh operations or the burst refresh operations are performed depending on the PASR code in a self-refresh mode, but only the piled refresh operations are performed in an auto-refresh mode.

With reference to FIG. 7, the refresh operations according to an embodiment of the present invention are described in detail.

As shown in FIG. 7, in the case of refreshing all four banks #0, #1, #2, and #3, a piled refresh operation is performed to sequentially refresh the bank #0, bank #1, bank #2 and bank #3 one at a time. In contrast, in the case of refreshing only banks #1 and #2, a burst refresh operation of refreshing both banks #1 and #2 is performed.

As described above and shown in Table 1 and FIG. 6, it is possible to perform both the piled refresh operation and the burst refresh operation based on the PASR scheme according to the present invention.

In addition, according to the refresh performance method of the present invention, the piled refresh operation is performed when it is necessary to refresh all banks, thereby reducing the maximum current consumption. In contrast, when it is necessary to refresh only a subset of banks, the burst refresh operation is performed, thereby reducing the fluctuation of supply voltage.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of refreshing a memory device having a N number of banks, the method comprising steps of:
   performing a piled refresh operation when refreshing all of the N number of banks; and
   performing a burst refresh operation based on a Partial Array Self Refresh (PASR) scheme when refreshing less than all of the N number of banks.

2. The method of claim 1, wherein the steps of performing the piled refresh operation and the burst refresh operation are performed in a self-refresh mode.

3. A method of refreshing a memory device having an N number of banks, the method comprising steps of:
   in a self-refresh mode, performing a refresh operation to refresh all N number of banks according to a piled refresh scheme;
   in a self-refresh mode, performing a refresh operation to refresh less than all N number of banks according to a Partial Array Self Refresh (PASR) scheme; and
   in an auto-refresh mode, performing a refresh operation according to the piled refresh scheme.

4. A method of refreshing a plurality of memory banks in a semiconductor memory device comprising steps of:
   receiving an auto-refresh signal;
   receiving a self-refresh signal;
   receiving a PASR code carrying information regarding which specific bank or banks are to be refreshed;
   activating the pile-refresh-signal to perform piled refresh operations either:
      i. when the auto-refresh signal is activated; or
      ii. when the self-refresh signal is activated but the PASR code specifies refreshing all memory banks; and
   deactivating a pile-refresh-signal to perform burst refresh operations when the self-refresh signal is enabled and when the PASR code specifies refreshing not all memory banks.

5. The method of claim 4 further comprising the step of performing the pile refresh operations comprising:
   a) receiving a refresh command signal;
   b) after receiving the refresh command signal, generating a signal for selecting a bank to be refreshed;
   c) generating an address signal of the bank to be refreshed;
   d) generating a signal for refreshing the bank indicated by the address signal;
   e) refreshing the bank indicated by the step d); and
   f) repeating the steps b)–e) when another memory bank is determined to be refreshed.

6. The method of claim 4, wherein, when a refresh command signal is received but the pile-refresh-signal is deactivated, a specific number of memory banks specified by the PASR code is refreshed simultaneously.

* * * * *